(12) United States Patent
Heydari

(10) Patent No.: US 11,343,940 B2
(45) Date of Patent: May 24, 2022

(54) CONFIGURABLE COLD-PLATES OF DATACENTER COOLING SYSTEMS

(71) Applicant: Nvidia Corporation, Santa Clara, CA (US)

(72) Inventor: Ali Heydari, Albany, CA (US)

(73) Assignee: NVIDIA CORPORATION, Santa Clara, CA (US)

( * ) Notice: Subject to any disclaimer, the term of this patent is extended or adjusted under 35 U.S.C. 154(b) by 4 days.

(21) Appl. No.: 17/004,963

(22) Filed: Aug. 27, 2020

(65) Prior Publication Data

US 2022/0071055 A1 Mar. 3, 2022

(51) Int. Cl.
*H05K 7/20* (2006.01)
*F28F 3/12* (2006.01)
*B21D 53/02* (2006.01)
*B23P 15/26* (2006.01)

(52) U.S. Cl.
CPC ..... *H05K 7/20254* (2013.01); *H05K 7/20772* (2013.01); *B21D 53/02* (2013.01); *B23P 15/26* (2013.01); *F28F 3/12* (2013.01)

(58) Field of Classification Search
CPC .......... H05K 7/20254; H05K 7/20763; H05K 7/20772; F28F 3/12
See application file for complete search history.

(56) References Cited

U.S. PATENT DOCUMENTS

| | | | | |
|---|---|---|---|---|
| 5,159,529 | A * | 10/1992 | Lovgren | H05K 7/20254 165/185 |
| 9,596,785 | B2 * | 3/2017 | Brand | H05K 7/20254 |
| 10,976,110 | B2 * | 4/2021 | Bungo | B23K 3/00 |
| 2008/0029260 | A1 | 2/2008 | Hu | |
| 2015/0366105 | A1 | 12/2015 | Dunwoody | |
| 2019/0366876 | A1 * | 12/2019 | Cheadle | B60L 50/64 |
| 2020/0359528 | A1 | 11/2020 | Tsai | |

FOREIGN PATENT DOCUMENTS

| | | | |
|---|---|---|---|
| CN | 207021255 U | * | 2/2018 |
| EP | 3907584 | | 11/2021 |
| TW | 202041827 | | 11/2020 |
| WO | 02/42703 | | 5/2002 |

OTHER PUBLICATIONS

Combined Search and Examination Report issued in GB Application No. GB2112263.5, dated Feb. 18, 2022.

* cited by examiner

*Primary Examiner* — Zachary Pape
(74) *Attorney, Agent, or Firm* — Hogan Lovells US LLP

(57) ABSTRACT

A cold plate that is configurable and for a datacenter liquid cooling system is disclosed. The cold plate includes a first section, a second section, and an intermediate layer, which is changeable and has first channels to enable flow of a coolant through the intermediate layer, and has second channels or at least one adapted second channel to concentrate the coolant or the flow of the coolant to at least one area within the configurable cold plate corresponding to at least a heat generating feature of an associated computing device.

15 Claims, 8 Drawing Sheets

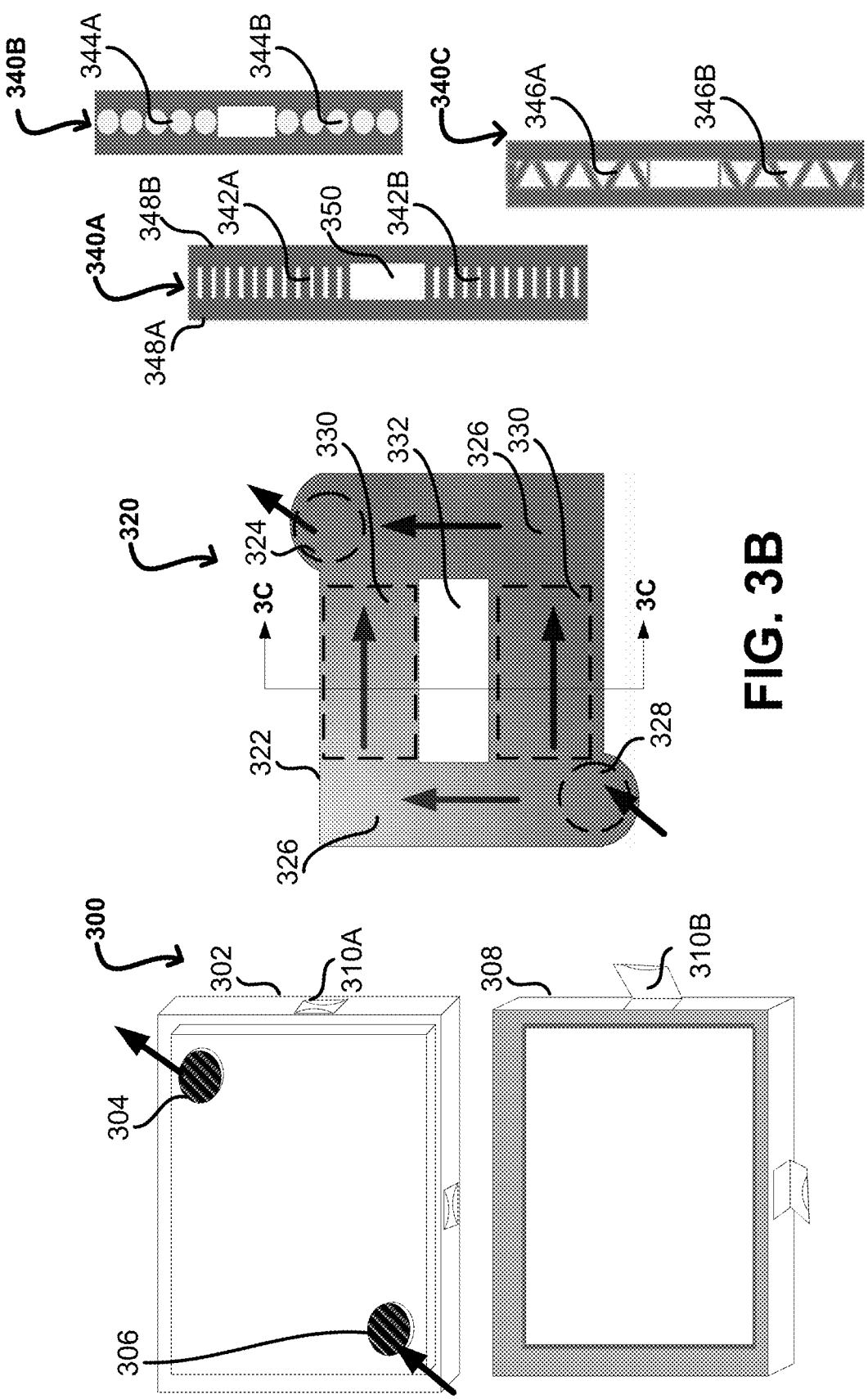

CONFIGURABLE COLD-PLATES OF DATACENTER COOLING SYSTEMS

FIELD

At least one embodiment pertains to a cold plate that is configuration and for a datacenter liquid cooling system. In at least one embodiment, the cold plate has a first section, a second section, and an intermediate layer, which is changeable and has first channels to enable flow of a coolant and has second channels or at least one adapted second channel to concentrate the coolant or the flow of the coolant to at least one area within the cold plate.

BACKGROUND

Datacenter cooling systems typically use fans to circulate air through server components. Certain supercomputers or other high capacity computers may use water or other cooling systems than air cooling systems to draw heat away from the server components or racks of the datacenter to an area external to the datacenter. The cooling systems may include a chiller within the datacenter area, including the area external to the datacenter. The area external to the datacenter may be an area including a cooling tower or other external heat exchanger that receives heated coolant from the datacenter and disperses the heat by forced air or other means to the environment (or an external cooling medium) before the cooled coolant is recirculated back into the datacenter. In an example, the chiller and the cooling tower together form a chilling facility with pumps responsive to temperature measured by external devices applied to the datacenter. Air cooling systems alone may not draw sufficient heat to support effective or efficient cooling in datacenters and liquid cooling systems may not distribute coolant effectively or efficiently.

BRIEF DESCRIPTION OF THE DRAWINGS

Various embodiments in accordance with the present disclosure will be described with reference to the drawings, in which:

FIG. 3A is a diagram illustrating perspective views of a first section and a second section of a configurable cold plate for a datacenter liquid cooling system, according to at least one embodiment;

FIG. 3B is a diagram illustrating a plan view of an intermediate layer for a configurable cold plate for a datacenter liquid cooling system, according to at least one embodiment;

FIG. 3C are diagrams illustrating various cross-section views showing second channels or an adapted second channel in an intermediate layer for a configurable cold plate for a datacenter liquid cooling system, according to at least one embodiment;

DETAILED DESCRIPTION

Figure 1:
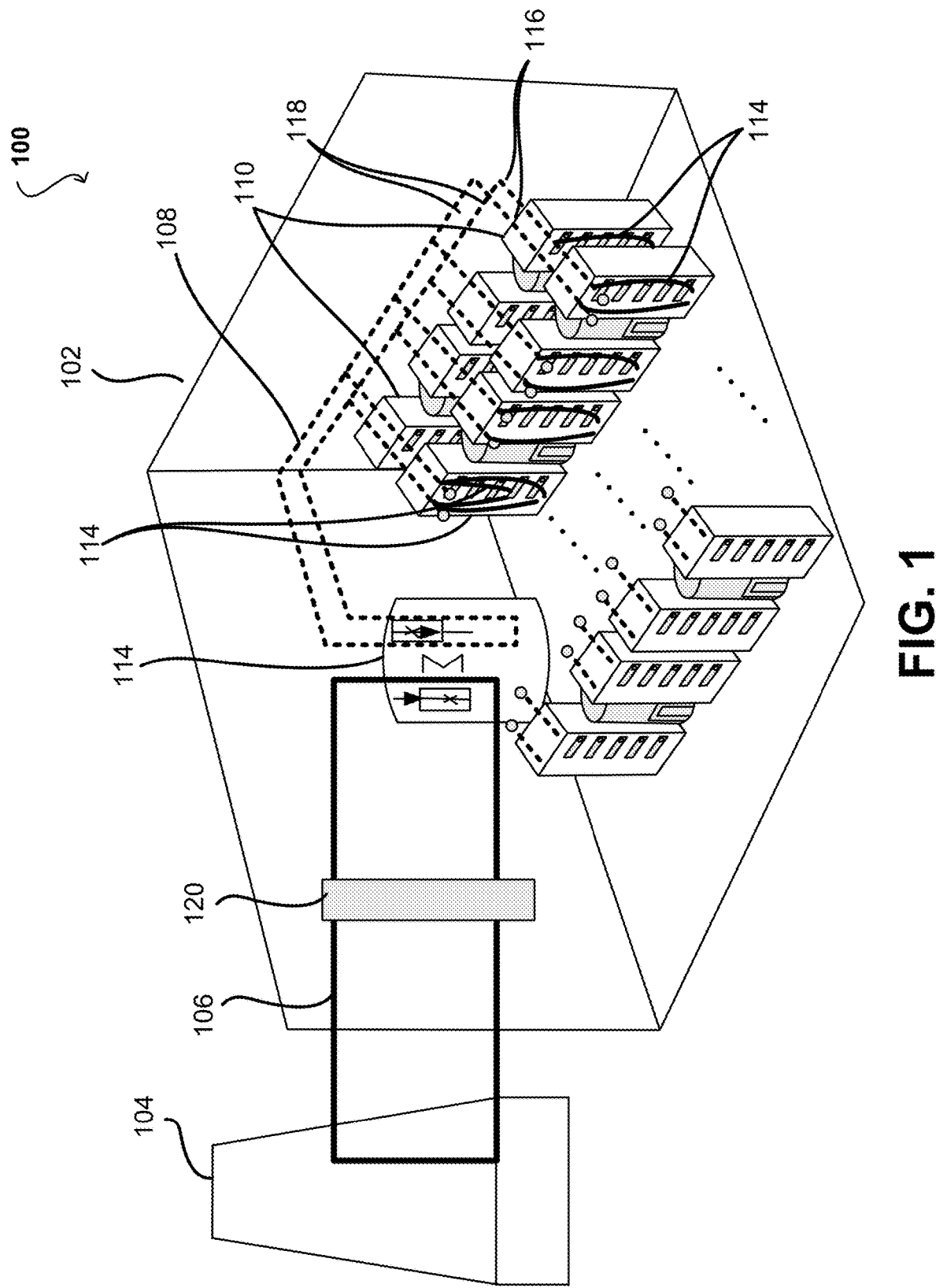
FIG. 1 is a block diagram of an example datacenter having a cooling system subject to improvements described in at least one embodiment.

Air cooling of high density servers may not be efficient or may be ineffective in view of sudden high heat requirements caused by changing computing-loads in present day computing components. However, as the requirements are subject to change or tend to range from a minimum to a maximum of different cooling requirements, these requirements must be met in an economical manner, using an appropriate cooling system. For moderate to high cooling requirements, liquid cooling system may be used. The different cooling requirements also reflect different heat features of the datacenter. In at least one embodiment, heat generated from the components, servers, and racks are cumulatively referred to as a heat feature or a cooling requirement as the cooling requirement must address the heat feature entirely. In at least one embodiment, the heat feature or the cooling requirement for a cooling system is the heat generated or the cooling requirement of the components, servers, or racks associated with the cooling system and may be of a portion of components, servers, and racks in the datacenter.

In at least one embodiment, a cold plate that is configurable and for a datacenter liquid cooling system is disclosed. The cold plate addresses design lag in liquid-cooled cold plates which may be standardized and may not be constructed to efficiently and effectively remove sufficient heat from an associated computing or datacenter device, such as a graphics processing unit (GPU), a switch, a dual inline memory module (DIMM), or a central processing unit (CPU). Furthermore, an associated computing or datacenter device may be a processing card having one or more GPUs, switches, or CPUs thereon. Each of the GPUs, switches, and CPUs may be a heat generating feature of the computing device. In at least one embodiment, the GPU, CPU, or switch may have one or more cores, and each core may be a heat generating feature. The ability to remove heat by the cold plate may be improved by the present disclosure, where, in at least one embodiment, the channels (or microchannels) are provided in an intermediate layer between a first section and a second section of a cold plate to concentrate a coolant or a flow of the coolant through the cold plate. In at least one embodiment, to concentrate a coolant or a flow of the coolant through the cold plate may be to increase surface area for concentrated heat or thermal transfer from a material of the intermediate layer (and consequently to the cold plate) to the coolant.

In at least one embodiment, a cold plate that is configurable and is for a datacenter liquid cooling system includes a first section, a second section, and the intermediate layer. The intermediate layer is changeable with other intermediate layers and is removably located within the first section and the second section that may be then hermetically sealed together using provided clips, in at least one embodiment. Each of the intermediate layers has first channels to enable flow of a coolant through the intermediate layer and has second channels or at least one adapted second channel to concentrate the coolant or the flow of the coolant to at least one area within the cold plate. In at least one embodiment, the at least one adapted second channel is differently dimensioned or patterned to distinguish from an individual first channel of the first channels. The different dimension or pattern enables the at least one adapted second channel to expose more surface area to a coolant within the at least one adapted second channel than the individual first channel.

In at least one embodiment, the adaptation for the at least one adapted second channel is waves structures or dimples throughout the at least one adapted second channel even though the at least one adapted second channel has similar dimensions to the individual first channel. The wave structures or dimples enable more surface area of the material of the intermediate layer to contact the coolant and transfer heat to the coolant than a plain or flat surface as in the case of the individual first channel. In at least one embodiment, the adaptations are material adaptations where the material in the at least one adapted second channel is different than a material of the first channel, and enables more heat transfer to the coolant than the individual first channel.

In at least one embodiment, the second channels or the at least one adapted second channel is located in the intermediate layer to correspond to at least a heat generating feature of an associated computing device. As such, it is possible in at least one embodiment, to determine cooling requirements of an associated computing device based in part on a location of a heat generating feature, such as a CPU, GPU, or a switch; and to then machine or select an intermediate layer having the second channels or the at least one adapted second channel in an area corresponding to the heat generating feature when the intermediate layer is hermetically sealed in the cold plate.

In at least one embodiment, the channels may be differently sized by at least a different dimension to its cross-section. In at least one embodiment, the channel is enabled by slots. In at least one embodiment, a first channel guides the coolant, while one or more of the second channels is adapted to have at least one different dimension than the first channel, where the different dimension ensures that coolant through the second channel is more or at faster flow rate than in the first channel. In at least one embodiment, the at least one different dimension also enables more surface area within the second channel to exchange more heat to the coolant from a material of the cold plate in the second channel relative to the first channel. In at least one embodiment, the slots enable a faster flow rate at least by a reduced cross-section to force coolant at a higher flow rate from one first channel to another first channel so that incoming coolant flows through the first channel at a first flow rate, the second channel at a second flow rate, and out the cold plate at the second flow rate or a slower flow rate. In at least one embodiment, the reduced cross-section also enables more material forming surface areas to interface more with the coolant and consequently transfer more heat to the coolant.

In at least one embodiment, the dimensioning of the channel or the provisioning of slots to function as the channels increases a heat transfer surface area within the cavity of the cold plate. The may be the case for a provided fluid (such as a coolant) inlet temperature and its flow rate. Therefore, in at least one embodiment, the second channels, by the dimensioning or slots, enable concentration of the coolant in areas having more heat transfer surface area within the cold plate. In at least one embodiment, the concentration of the coolant is in reference to concentration of heat or thermal transfer surface area within second channels that is more than the first channels. This application presents a unique method of increasing the heat removal ability of a cold plate by changing the micro-channel design and placement in a universal cold plate design.

In at least one embodiment, each cold plate is composed of the first section which may be an upper section having inlets and outlets for fluid (such as a coolant) of a secondary cooling loop. Each cold plate is composed of the second sections that may be a lower section to fit hermetically with the first section. In at least one embodiment, provision is made in one or more of the first section and the second section for gaskets to enable the hermetic seal. Fluid-flow channels or micro-channels are provided in different configurations or adaptations of intermediate layers to concentrate the flow of coolant or the coolant in different areas of the intermediate layer, which translates to different areas of the cold plate when the intermediate layer is fixed in the lower section and the upper section is sealed to the lower section. In at least one embodiment, the seal is hermetic, but is also removable to enable replacement of the intermediate layer. In at least one embodiment, the intermediate layer is composed of multiple parts, where the first channels form one part that may be removably inserted into the lower portion first, while the second channels or the adapted second channel is a second part to be inserted, removably, into the lower portion in a second step.

In at least one embodiment, a selection of a micro-channels or channels inside the cavity of one or more of the two parts is made from uniquely designed parts already available for use with a variety of different computing devices. In at least one embodiment, the micro-channels or channels are machined specifically for a computing device. In at least one embodiment, the machining includes drilling, forming, computer-aided machining, growing or printing. The unique designs of the intermediate layer or parts thereof for the cold plate enable removing of desired amounts of heat with provisions for a resulting pressure drop to be achieved in the coolant flow that is an acceptable pressure drop to address cooling requirements of the computing devices. The selection or machining of the micro-channels or channels may, in at least one embodiment, include selection of materials, surface finish, and angles of the surface or cross-section (such as straight, waviness, width/height) of the channels to create desired flow characterization for any amount of inlet flow, for different inlet fluid temperature, fluid chemistry, and rated pressure drops.

FIG. 1 is a block diagram of an example datacenter 100 having a cooling system subject to improvements described in at least one embodiment. The datacenter 100 may be one or more rooms 102 having racks 110 and auxiliary equipment to house one or more servers on one or more server trays. The datacenter 100 is supported by a cooling tower 104 located external to the datacenter 100. The cooling tower 104 dissipates heat from within the datacenter 100 by acting on a primary cooling loop 106. Further, a cooling distribution unit (CDU) 112 is used between the primary cooling loop 106 and a second or secondary cooling loop 108 to enable extraction of the heat from the second or secondary cooling loop 108 to the primary cooling loop 106. The secondary cooling loop 108 can access various plumbing all the way into the server tray as required, in an aspect. The loops 106, 108 are illustrated as line drawings, but a person of ordinary skill would recognize that one or more plumbing features may be used. In an instance, flexible polyvinyl chloride (PVC) pipes may be used along with associated plumbing to move the fluid along in each of the loops 106, 108. One or more coolant pumps, in at least one embodiment, may be used to maintain pressure differences within the loops 106, 108 to enable the movement of the coolant according to temperature sensors in various locations, including in the room, in one or more racks 110, and/or in server boxes or server trays within the racks 110.

In at least one embodiment, the coolant in the primary cooling loop 106 and in the secondary cooling loop 108 may be at least water and an additive, for instance, glycol or propylene glycol. In operation, each of the primary and the secondary cooling loops has their own coolant. In an aspect, the coolant in the secondary cooling loops may be proprietary to requirements of the components in the server tray or racks 110. The CDU 112 is capable of sophisticated control of the coolants, independently or concurrently, in the loops 106, 108. For instance, the CDU may be adapted to control the flow rate so that the coolant(s) is appropriately distributed to extract heat generated within the racks 110. Further, more flexible tubing 114 is provided from the secondary cooling loop 108 to enter each server tray and to provide coolant to the electrical and/or computing components. In the present disclosure, the electrical and/or computing components are used interchangeably to refer to the heat-generating components that benefit from the present datacenter cooling system. The tubing 118 that form part of the secondary cooling loop 108 may be referred to as room manifolds. Separately, the tubing 116 extending from tubing 118 may also be part of the secondary cooling loop 108 but may be referred to as row manifolds. The tubing 114 enters the racks as part of the secondary cooling loop 108 but may be referred to as rack cooling manifold. Further, the row manifolds 116 extend to all racks along a row in the datacenter 100. The plumbing of the secondary cooling loop 108, including the manifolds 118, 116, and 114 may be improved by at least one embodiment of the present disclosure. An optional chiller 120 may be provided in the primary cooling loop within datacenter 102 to support cooling before the cooling tower. To the extent additional loops exist in the primary control loop, a person of ordinary skill would recognize reading the present disclosure that the additional loops provide cooling external to the rack and external to the secondary cooling loop; and may be taken together with the primary cooling loop for this disclosure.

In at least one embodiment, in operation, heat generated within server trays of the racks 110 may be transferred to a coolant exiting the racks 110 via flexible tubing of the row manifold 114 of the second cooling loop 108. Pertinently, second coolant (in the secondary cooling loop 108) from the CDU 112, for cooling the racks 110, moves towards the racks 110. The second coolant from the CDU 112 passes from on one side of the room manifold having tubing 118, to one side of the rack 110 via row manifold 116, and through one side of the server tray via tubing 114. Spent second coolant (or exiting second coolant carrying the heat from the computing components) exits out of another side of the server tray (such as enter left side of the rack and exits right side of the rack for the server tray after looping through the server tray or through components on the server tray). The spent second coolant that exits the server tray or the rack 110 comes out of different side (such as exiting side) of tubing 114 and moves to a parallel, but also exiting side of the row manifold 116. From the row manifold 116, the spent second coolant moves in a parallel portion of the room manifold 118 going in the opposite direction than the incoming second coolant (which may also be the renewed second coolant), and towards the CDU 112.

In at least one embodiment, the spent second coolant exchanges its heat with a primary coolant in the primary cooling loop 106 via the CDU 112. The spent second coolant is renewed (such as relatively cooled when compared to the temperature at the spent second coolant stage) and ready to be cycled back to through the second cooling loop 108 to the computing components. Various flow and temperature control features in the CDU 112 enable control of the heat exchanged from the spent second coolant or the flow of the second coolant in and out of the CDU 112. CDU 112 is also able to control a flow of the primary coolant in primary cooling loop 106.

In at least one embodiment, the cold plates herein support changes in power and thermal characteristics of various computing component without a need for a new cold plate and merely by replacing the intermediate layer. In at least one embodiment, therefore, the cold plates herein enable a universal cold plate with an ability to follow changes to computing components, but also to allow replacing of internal heat transfer assembly or chemistry of a fluid that may otherwise affect the performance of a cold plate if not for different channel sizing that may compensate for these changes. In addition, the ability to change the intermediate layer enables design teams to quickly and seamlessly design and deploy liquid cooling components for servers in datacenter applications. The cold plates herein also enable use of a universal class of liquid cooling by at least replacing thermal characteristics of the cold plate, such as the microchannels, which translate to a modification of the cold plate design to meet and exceed the datacenter needs.

Figure 2A:
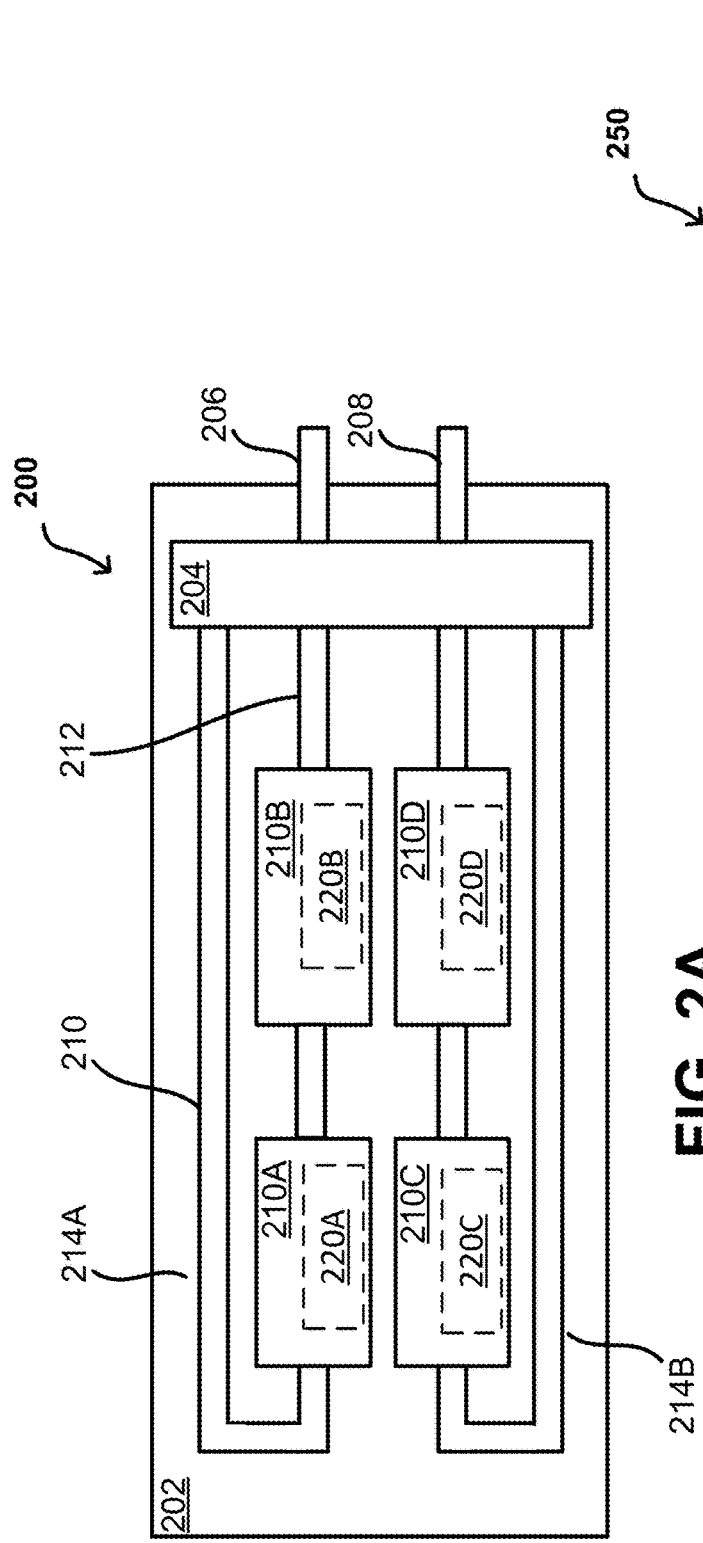
FIG. 2A is a block diagram illustrating server-level features associated with a configurable cold plate for a datacenter liquid cooling system, according to at least one embodiment.

FIG. 2A is a block diagram 200 illustrating server-level features associated with a configurable cold plate for a datacenter liquid cooling system, according to at least one embodiment. The server-level features include a server tray or box 202 having at least one server manifold 204 to allow entry and egress of cooling fluid such as a coolant from a rack to the server tray or box 202. Coolant from a rack manifold enters via inlet pipe 206 and exists via outlet pipe 208. The coolant, on the server side travels via inlet line 210, through one or more cold plates 210A, 210B, and via outlet line 212 to the manifold 204. This represents at least one or multiple cooling loops 214A, 214B within the server tray or box 202. In at least one embodiment, the cold plates 210A-D are associated with at least one computing component 220A-D.

In at least one embodiment, one or more of the cold plates 210A-D are configurable cold plates. In at least one embodiment, even though illustrated as having one inlet and one outlet for inlet line 210 and for outlet line 212, there may be multiple intermediate lines, such as flexible pipes associating the cold plate with the respective inlet line 210 and outlet line 212. In at least one embodiment, the intermediate lines directly couple the cold plate to the manifold 204 are provided inlet and outlets for such connections. In at least one embodiment, fluid adapters are provided to enable such coupling. In at least one embodiment, the fluid adapters are sized to the inlet and outlet provisions in the cold plate and the manifold 204.

Figure 2B:
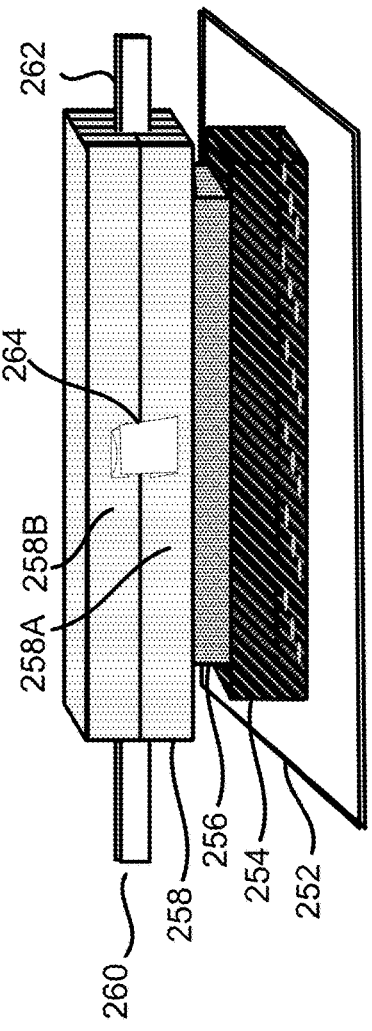
FIG. 2B is a block diagram illustrating component-level features associated with a configurable cold plate for a datacenter liquid cooling system, according to at least one embodiment.

FIG. 2B is a block diagram 250 illustrating component-level features associated with a configurable cold plate for a datacenter liquid cooling system, according to at least one embodiment. The component-level features include a computing or datacenter device formed of one or more of components 252, 254. In at least one embodiment, component 252 is a board or card, such as a printed circuit board (PCB) or printed circuit card that in enveloped and shielded to protect components therein. In at least one embodiment, component 254 is a chip or semiconductor device, such as a CPU, a GPU, or a switch. In at least one embodiment, even though only one component 254 is illustrated, the PCB 252 may have multiple components mounted thereon. In at least one embodiment, the component 254 may include multiple die (such as a multi-core processor device). In at least one embodiment, the cores may be stacked or distributed. In at least one embodiment, the components 252; 254 may have different heat generating features represented by at least locations of the die therein. In the case of the PCF 252, when there are multiple components 254 thereon, each component may be a heat generating feature.

In at least one embodiment, a cold plate 258 is associated with the computer device. In the illustration of FIG. 2B, the cold plate 258 is associate with the computing device 254. In at least one embodiment, the cold plate 258 may extend throughout the dimensions of the PCB 252 to provide direct or indirect contact cooling to one or more computing components on the PCB 252. In at least one embodiment, when a graphics processing card is the computing device, the cold plate 258 extends over the entire card, but the channels therein may enable concentration of coolant or the flow of coolant over areas of the card having processor or memory-intensive computing devices. The computing device may therefore have further computing devices associated therewith.

In at least one embodiment, the cold plate 258 is associated with the computing device 254 via a thermal transfer layer 256. The thermal transfer layer may be a layer having one or more of silicon, a thermal interface material, or air. In at least one embodiment, there may be no thermal transfer layer 256 and a bottom section 258A may be directly associated with the computing device 254. The cold plate has a top section 258B with at least one inlet for coolant inlet line 260 and at least one outlet for coolant outlet line 262. In at least one embodiment, the top section 258B is hermetically seal with the bottom section 258A using gaskets in between and at least a latch clip 264, although multiple latch clips may be provided throughout the sides of the top and the bottom sections to latch the sections together. In at least one embodiment, there may be a hinge on at least one side to keep the sections together during changing of an intermediate layer therein.

FIG. 3A is a diagram illustrating perspective views 300 of a first section 302 and a second section 308 of a configurable cold plate for a datacenter liquid cooling system, according to at least one embodiment. The first section 302 and the second section 308 may be associated with one or more intermediate layers, such as an intermediate layer illustrated in FIG. 3B. In at least one embodiment, one or more gaskets are associated with at least the first section or the second section to enable a hermetic seal once the first section and the second section is closed together. In at least one embodiment, latch chips formed of two sides, a latch receiver 310A and a latch 310B enable the hermetic seal by holding the sections together.

In at least one embodiment, fluid adapters 304, 306 extend from the configurable cold plate to enable receipt and egress of the coolant between the cold plate and at least a cooling manifold, such as the server manifold illustrated in FIG. 2A.

In at least one embodiment, the bottom section 308 enables a perfect fit for the intermediate layer that sits flush within the bottom section 308. Moreover, in at least one embodiment, there is minimum room for any fluid to flow between the bottom section 308 and the intermediate layer. Indeed, the intermediate layer, in at least one embodiment, may have one or more orifices (such as marked sections 324, 328 in FIG. 3B) within the layer to support the fluid adapters 304, 306, or to enable smooth flow (such as any flow less than a turbulent flow) of a coolant from the server manifold into the intermediate layer without spillage into any gap between the bottom section 208 and the intermediate layer. In at least one embodiment, coolant or other fluid flows into inlet fluid adapter 306 and out of the outlet fluid adapter 304. In at least one embodiment, even if there are no orifices in the intermediate layer, the fluid or coolant is still enabled to flow as directed by first channels and second channels of the intermediate layer.

Figure 3E:
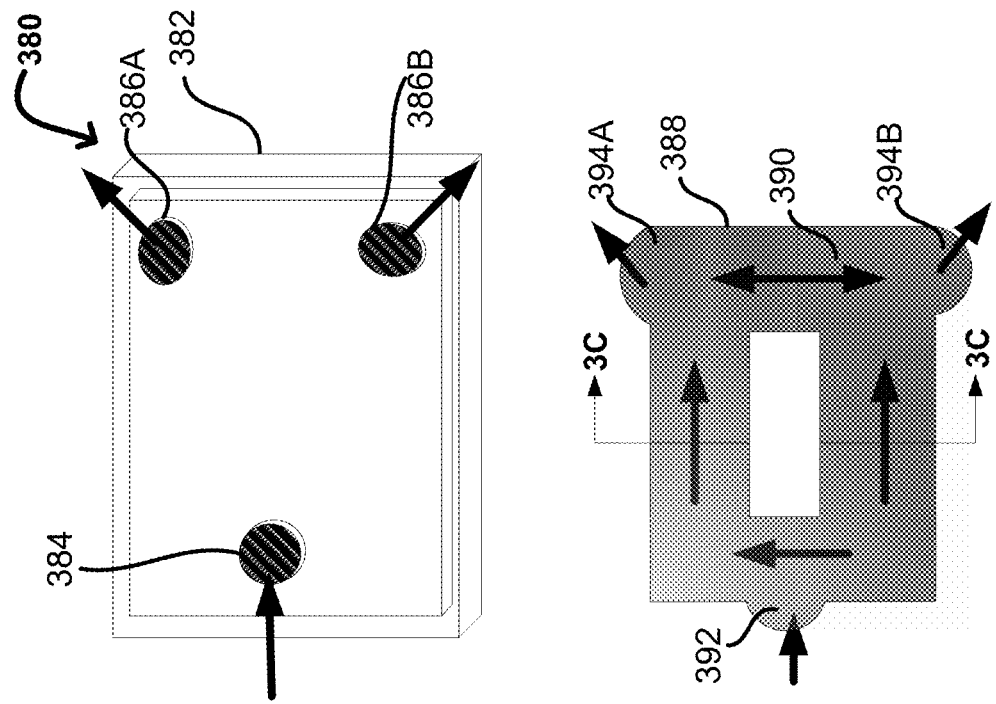
FIG. 3E are diagrams illustrating a plan view of another first section and anther associated intermediate layer for a configurable cold plate for a datacenter liquid cooling system, according to at least one embodiment.

FIG. 3B is a diagram illustrating a plan view 320 of an intermediate layer 322 for a configurable cold plate for a datacenter liquid cooling system, according to at least one embodiment. In at least one embodiment, the intermediate layer 322 is changeable with other intermediate layers, such as the intermediate layers illustrated in FIGS. 3D and 3E. The intermediate layer 322 includes first channels 326 to enable flow of a coolant through the intermediate layer 322 and includes second channels (or at least one adapted second channel) 330 to concentrate the coolant or the flow of the coolant to at least one area within the intermediate layer 322. In at least one embodiment, when the intermediate layer is in the cold plate, the concentration of the coolant or the flow of the coolant is to at least one area of the cold plate that coincides with the at least one area of the intermediate layer 322.

In at least one embodiment, there may be a second channel 330 that is differently dimensioned from the first channels 326. The different dimension of the second channel 330 may be to concentrate the coolant or the flow of the coolant to at least one area within the intermediate layer 322. In at least one embodiment, to concentrate the coolant or the flow of the coolant to at least one area within the intermediate layer may be described by an amount of cooling provided in the at least one area relative to other areas of the intermediate layer (and consequently of the cold plate when the intermediate layer is within the cold plate). In at least one embodiment, to concentrate the coolant or the flow of the coolant to at least one area within the intermediate layer may be described by the amount of surface area (also referred to as heat or thermal transfer surface area) within the at least one area that is exposed to coolant than in other areas of the intermediate layer (and consequently of the cold plate when the intermediate layer is within the cold plate). In at least one embodiment, to concentrate the coolant or the flow of the coolant in the at least one area may be described by an increase to the concentration of the coolant or an increase in the flow of the coolant in the at least one area relative to other areas of the intermediate layer (and consequently of the cold plate when the intermediate layer is within the cold plate).

In at least one embodiment, the second channel has slots in the intermediate layer. An individual slot of the slots has at least one first dimension that is different relative to an individual first channel in the first channels and across their respective cross-sections. In at least one embodiment, the individual slot has a diameter, width, height, or angle that is lesser than that of the individual first channel. In at least one embodiment, this enables multiple slots in the area of the second channel. The multiple slots have walls forming sides surface areas therein. The side surface areas are plainly referred to as surface areas or as thermal transfer or heat transfer surface areas because they enable more heat transfer to a coolant passing through. The surface areas may also be at the top and bottom of the slots. In at least one embodiment, a second intermediate layer is available for each cold plate. The second intermediate layer is to be used in the alternative of the intermediate layer. Individual second slots of the second intermediate layer may have at least one second dimension that is different relative to the at least one first dimension. The at least one second dimension is different to concentrate more or less of the coolant or the flow of the coolant to the at least one area or to a different area within the cold plate relative to the first intermediate layer.

In at least one embodiment, the flow of the coolant refers to flow rate or flow volume of the coolant in the at least one area relative to the other areas of the intermediate layer. In at least one embodiment, the coolant is in a dynamic state and is continuously moving through the cold plate. However, as illustrated in at least one embodiment, the first channels 326 may be narrower than the second channel 330. As such, the coolant spends more time in the second channel 330 than in the first channels 326. In at least one embodiment, to concentrate the coolant or the flow of the coolant may be to slow a flow rate of the coolant so that the coolant spends more time exchanging heat from an associated computing device in the at least one area having the second channels. In at least one embodiment, to concentrate the coolant or the flow of the coolant may be to increase the flow rate of the coolant so that the coolant does not saturate with exchanged heat from an associated computing device in the at least one area having the second channels. As the coolant is flowing faster, it may cool the at least one area faster or enable faster heat exchange. In at least one embodiment, even though the second channels 330 may be broader than the first channels 326, the second channels 330 be represented by slots that cause a pressure gradient between the first channels 326, so that a higher flow rate is experienced in the at least one area having the second channels 330.

In at least one embodiment, the at least one adapted second channel is described by having one different dimension than the first channel. The second channel or the at least one adapted second channel is in the intermediate layer to correspond to at least a heat generating feature of an associated computing device. In doing so, in at least one embodiment, the cold plate is configurable to maximize heat exchange from the heat generating feature of the associated computing device. This represents at least an effective and efficient heat exchange process than using a static cold plate that evenly distributes coolant. In at least one embodiment, one or more orifices (such as marked sections 324, 328 in FIG. 3B) within the intermediate layer 322 support the fluid adapters 304, 306, or enable smooth flow (such as any flow less than a turbulent flow) of a coolant from the server manifold into the intermediate layer 322 without spillage into any gap between a bottom section and the intermediate layer 322 when the intermediate layer 322 is removably located within the bottom section.

In at least one embodiment, a seal such as a rubber, silicone, or inactive material is provided around the orifices to adequately prevent flow of coolant outside the intermediate layer. In at least one embodiment, the fluid adapters extend under the top section of the cold plate into the orifices and are held snuggly by the seals. To change the intermediate layer, with the top section of the cold plate open, the intermediate layer may be pulled out and the seal may come out with the intermediate layer. In at least one embodiment, to ensure integrity, new seals may be required for each new or different intermediate layer used. In at least one embodiment, a similar seal is provided for fluid adapters 304, 306 to enable coupling to the coolant lines from the server manifold or a related cooling loop.

FIG. 3C are diagrams illustrating various cross-section views 340A, B, C showing second channels 342A, B; 344A, B; and 346A, B (or an adapted second channel) in an intermediate layer for a configurable cold plate for a datacenter liquid cooling system, according to at least one embodiment. In at least one embodiment, the intermediate layer 322 is a sandwich structure having a top plate 348B and a bottom plate 348A that are separated by walls (such as the vertical, angled, or circumferential structures forming the channels). The walls may hold up the top plates. In at least one embodiment, there is only a bottom plate and the walls abutting from the bottom plate provide a channel that may be open on top or that may be closed by a top section of the cold plate when the intermediate layer is located within the cold plate. The top section of the cold plate then functions as a closure to the walls.

In at least one embodiment, a middle channel 332; 350 is either closed or formed as an additional first channel, along with the first channels 326 on either side of the intermediate layer 322. In at least one embodiment, when the middle channel 332; 350 is closed, it is formed as a through-hole from plan to bottom view of the intermediate layer 322 and blocked off by walls so that the coolant does not flow through this area. In at least one embodiment, the middle channel 332; 350 is at least one second channel that may be differently dimensioned so as to concentrate a second amount of coolant or a second flow of coolant through the middle channel 332 relative to a first concentration of coolant or first flow of coolant to the first channels 326 and the second channels 330.

Figure 3D:
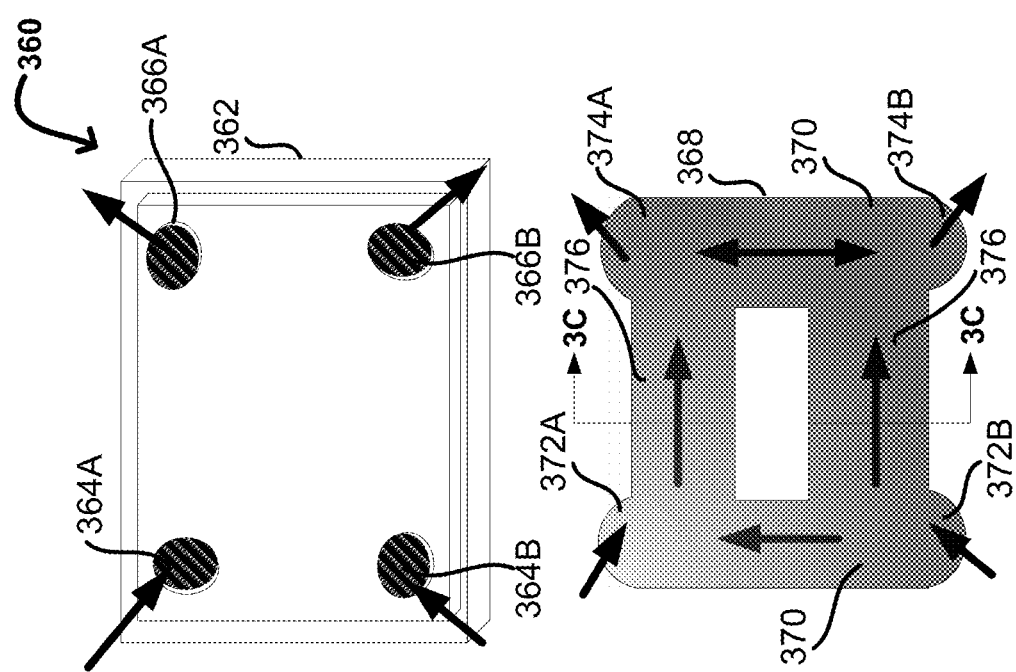
FIG. 3D are diagrams illustrating a plan view of a first section and an associated intermediate layer for a configurable cold plate for a datacenter liquid cooling system, according to at least one embodiment.

In at least one embodiment, the cross-section views 340A, B, or C may be found across any one of the embodiment intermediate layers of FIGS. 3B, 3D, and 3E. In at least one embodiment, walls forming the second channels 342A, B in the cross-section view 340A are vertical (or perpendicular with respect the top section and the bottom sections of the cold plate). In at least one embodiment, walls forming the second channels 346A, B in cross-section view 340C are angled (with respective to the top section and/or the bottom section of the cold plate). In at least one embodiment, the sandwich structure of plates 348A, B is initially a machined unibody structure, but the channels 344A, B are formed by holes drilled through the middle of the unibody structure along its length or width. In at least one embodiment, the channels may be round and have a diameter as its dimension for reference.

In at least one embodiment, the walls form slots therebetween and the slots traverse a length of the second channels or of the at least one adapted second channel. Furthermore, the slots, representing the second channel, concentrate the coolant or the flow of the coolant to the at least one area by at least enabling parallel flows through the slots. The walls represent additional surface area forming as interface to exchange heat between an underlying computing device and the coolant. In at least one embodiment, the middle channel 350 is available in each of the embodiments of FIG. 3C. In at least one embodiment, a mix of walls (vertical, angled, or circumferential) may be used in different channels within a singular intermediate layer.

FIG. 3D are diagrams illustrating a plan view 360 of a first section 362 and an associated intermediate layer 368 for a configurable cold plate for a datacenter liquid cooling system, according to at least one embodiment. The plan view 360 illustrates that, different from the embodiment in FIGS. 3A and 3B, there may be two inlet fluid adapters 364A, B that support two inlets 372A, B for coolant to the intermediate layer 368 and there may be two outlet fluid adapters 366A, B to support two outlets 374A, B for the coolant. As described with respect to FIGS. 3A-C, there may be associated seals with orifices into the sandwich structure of the intermediate layer 368. Alternatively, the coolant flows from the fluid adapter into the intermediate layer and through the channels before flowing out. In at least one embodiment, the many surface areas enabled by the slots described in FIG. 3C is sufficient to concentrate the coolant or the flow of the coolant in the areas having the slots in the intermediate layer (and consequently of the cold plate).

In at least one embodiment, coolant enters the intermediate layer 368 from the inlet fluid adapters 364A, B of the top section 362. The coolant flows, as indicated by the arrows, thorough one or more first channels 370, through one or more second channels 376, out of the outlets 374A, B provided in the intermediate layer 368, and finally, through either of the outlet fluid adapters 366A, B. In at least one embodiment, any of the cross-sections discussed with respect to FIG. 3C may be applicable to a cross-section of the intermediate layer 368.

FIG. 3E are diagrams illustrating a plan view 380 of another first section 382 and anther associated intermediate layer 388 for a configurable cold plate for a datacenter liquid cooling system, according to at least one embodiment. The plan view 380 illustrates that, different from the embodiment in FIGS. 3A, 3B, and 3D, there may be only one inlet fluid adapters 384 that support one inlet 392 for coolant to the intermediate layer 368, and there may be multiple outlet fluid adapters 386A, B to support two outlets 394A, B for the coolant. These features may enable a higher flow rate due to pressure difference from higher outlet pressures enabled by multiple outlet and lower inlet pressures from a singular inlet. In at least one embodiment, knowledge of the fluid dynamics may be provided for selection of the appropriate intermediate layer. In at least one embodiment, when an existing cooling loop is experiencing low coolant pressure (such as towards an end of the line, a last rack, of the coolant plumbing), a single inlet intermediate layer may enable increase flow rate for the coolant.

In at least one embodiment, as described with respect to FIGS. 3A-C, there may be associated seals with orifices into the sandwich structure of the intermediate layer 388 for the inlet and the outlets of the intermediate layer. Alternatively, the coolant flows from the fluid adapter 384 into the intermediate layer and through the channels before flowing out. In at least one embodiment, the many surface areas enabled by the walls forming the slots described in FIG. 3C is sufficient to concentrate the coolant or the flow of the coolant in the areas having the slots in the intermediate layer (and consequently of the cold plate). In at least one embodiment, coolant enters the intermediate layer 388 from the inlet fluid adapter 384 of the top section 382. The coolant flows, as indicated by the arrows, thorough one or more first channels, through one or more second channels, out of the outlets 394A, B provided in the intermediate layer 388, and finally, through either of the outlet fluid adapters 394A, B. In at least one embodiment, any of the cross-sections discussed with respect to FIG. 3C may be applicable to a cross-section of the intermediate layer 388.

Figure 4:
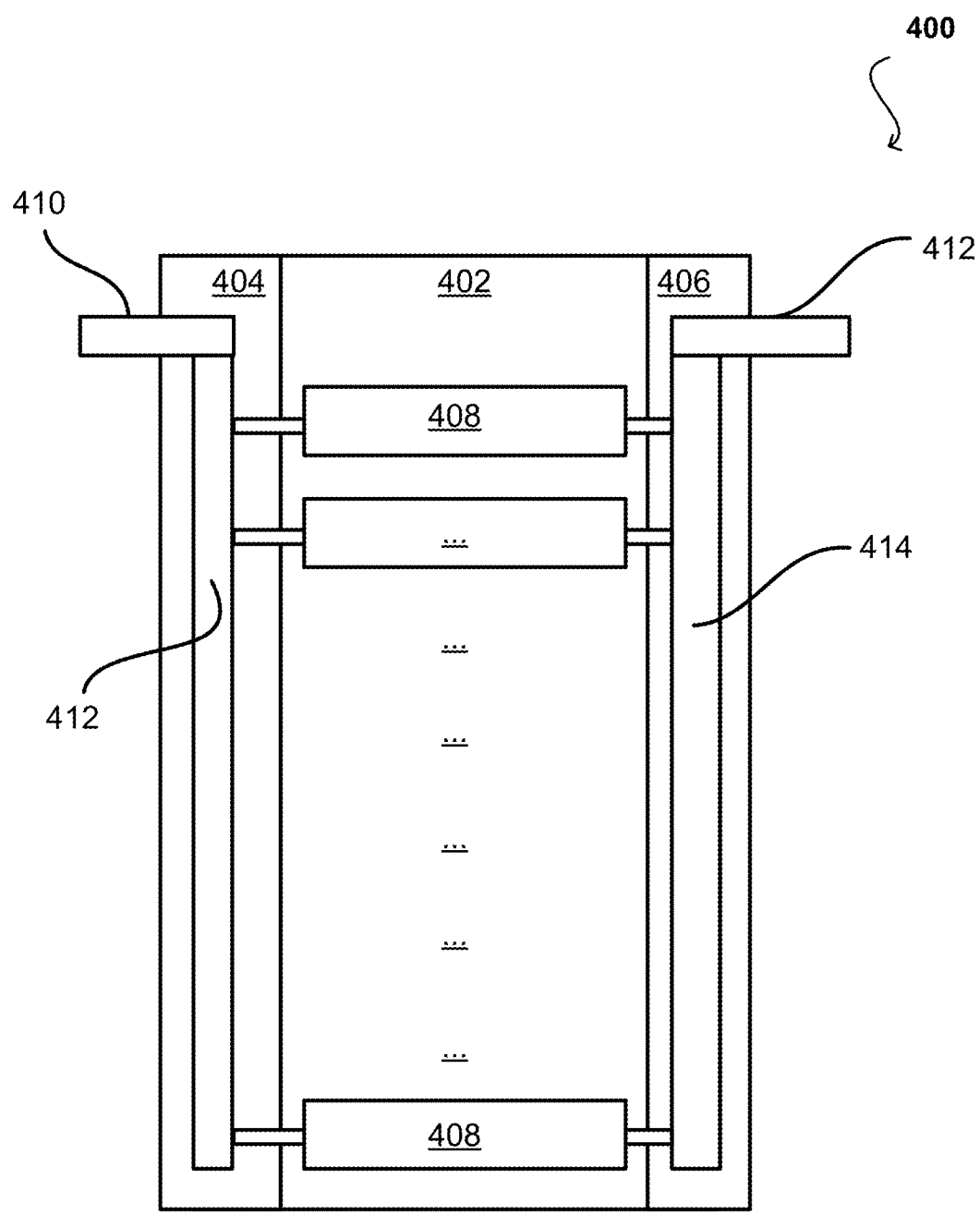
FIG. 4 is a block diagram illustrating rack-level features associated with a configurable cold plate for a datacenter liquid cooling system, according to at least one embodiment.

FIG. 4 is a block diagram illustrating rack-level features 400 associated with a configurable cold plate for a datacenter liquid cooling system, according to at least one embodiment. A rack 402 has brackets 404, 406, to enable hanging of one or more cooling loop components within the rack 402. In at least one embodiment, rack manifolds 412, 414 may be provided to guide coolant from row manifolds to the server trays or boxes 408 with the rack 402. The rack manifolds 412 may pass coolant from the row manifolds through conduit 410, through the server trays or boxes 408, out of the egress row manifold 414, and back into the row manifold via the egress conduit 412. The configurable cold plates may use higher pressure intermediate layers towards the bottom server tray or box of the illustrated server trays or boxes 408, if there is a need to increase pressure of coolant flow at that level. Alternatively, as coolant head pressure is higher at the bottom, the higher-pressure intermediate layers may be used in cold plates of the top server tray or boxes of the illustrated rack 402.

Figure 5A:
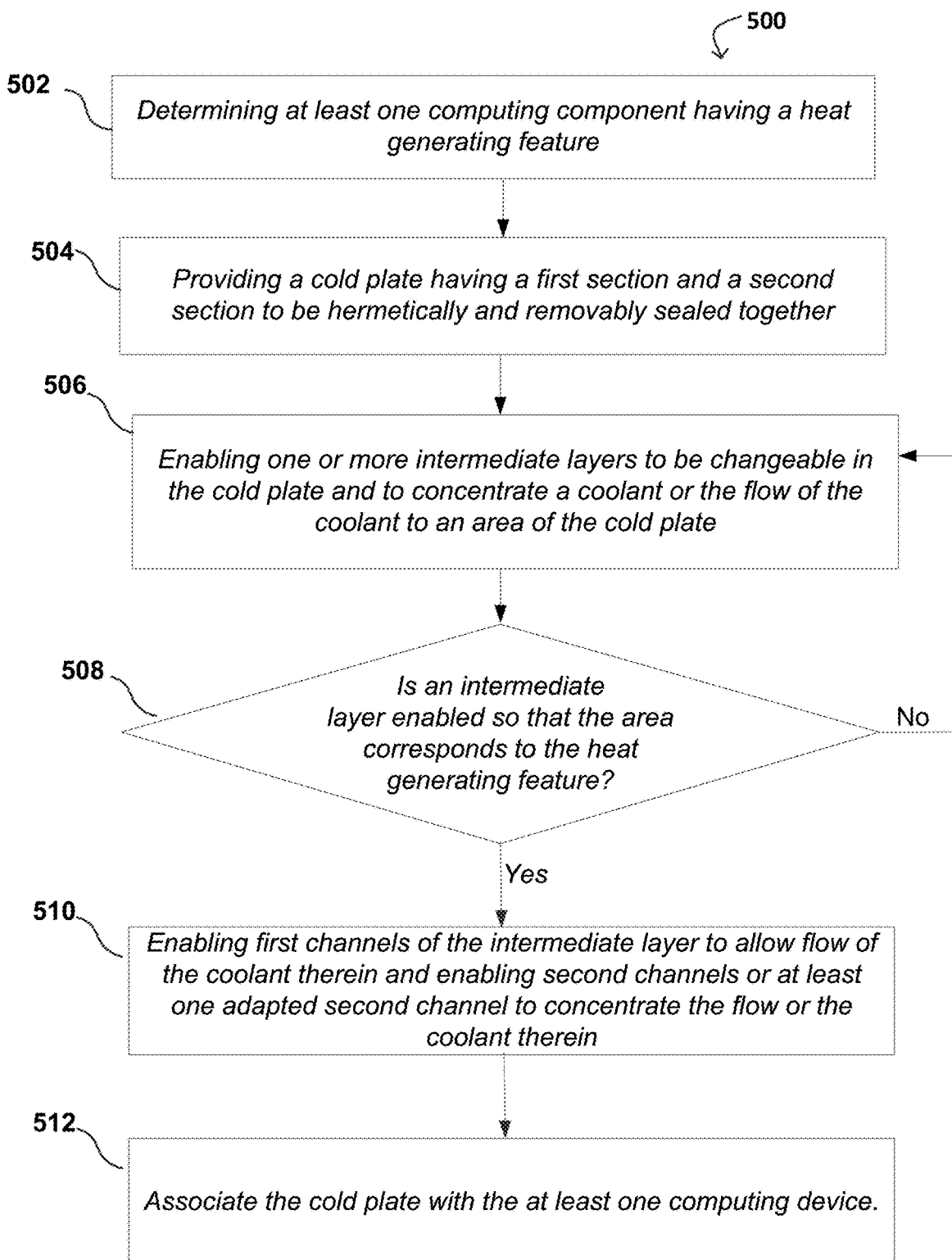
FIG. 5A is a process flow of steps available for a method of using the configurable cold plate of FIGS. 2A-4, according to at least one embodiment.

FIG. 5A is a process flow of steps available for a method 500 of using the configurable cold plate of FIGS. 2A-4, according to at least one embodiment. Step 502 determines at least one computing component having a heat generating feature, such as a processor core or a processor, a switch, or a memory component. In at least one embodiment, a sub-step of step 502 requires determining an area of the cold plate that is associated with the heat generating feature. In at least one embodiment, the area is also a reference to a location in the at least one computing device where heat generation is maximum during normal usage of the at least one computing device. In at least one embodiment, a location where the heat generation is maximum during saturated use of the at least one computing device is used as a basis to perform the subsequent steps for selecting or providing an intermediate layer.

Step 504 provides a cold plate having a first section and having a second section to be hermetically and removably sealed together. Step 506 enables one or more intermediate layers to be changeable in the cold plate and to concentrate a coolant or a flow of the coolant to an area of the cold plate. In at least one embodiment, step 506 includes a sub-step of determining that a first individual intermediate layer has second channels or at least one adapted second channel to concentrate the coolant or the flow of the coolant to a first area within the cold plate; and determining that a second individual intermediate layer has different second channels or at least one adapted and different second channel than the first individual intermediate layer to concentrate the coolant or the flow of the coolant to a second area within the cold plate. In at least one embodiment, step 506 includes a sub-step of making the intermediate layer to the requirements of the at least one computing component, as discussed with respect to method 550.

Step 508 determines whether an intermediate layer from step 506 is enabled for the at least one computing device at least the first area correspond to the location of the heat generating feature. When this is the case, step 508 enables the first channels of the first individual intermediate layer to allow flow of the coolant therein and enables second channels or at least one adapted second channel to concentrate the flow or the coolant therein. In at least one embodiment, the second individual intermediate layer may be determined as appropriate for the at least one computing device and used instead of he first individual intermediate layer.

Method 500 therefore enables one or more intermediate layers to be removably located within the first section and the second section. Method 500 enables a first individual intermediate layer of the one or more intermediate layers to be changeable with a second individual intermediate layer.

Method 500 ensures that the one or more interchangeable intermediate layers have respective first channels to enable flow of a coolant therein, and have respective second channels or respective at least one adapted second channel to concentrate the coolant or the flow of the coolant within the cold plate to correspond to the heat generating feature.

In at least one embodiment, method 500 includes a further step 512 for associating the cold plate with the at least one computing component. A sub-step may include associating an inlet coolant line to an inlet of the first section and an outlet coolant line to an outlet of the first section. When the coolant flow is initiated, coolant will flow through the inlet cooling line and the inlet of the first section, to the first channels and the second channels or at least one adapted second channel to concentrate the flow or the coolant therein.

In at least one embodiment, when during operation it is determined to change the at least one computing device by replacing it with a second computing component that has a second heat generating feature, a further step of the method 500 or a sub-step of step 506 foresees such a change. The sub-step either preempts or performs a new determining step for a second area within the cold plate associated with the second heat generating feature. In at least one embodiment, the second individual intermediate layer may be pre-qualified for the second computing device because it has the second channels or at least one adapted second channel differently located than the first individual intermediate layer. This allows the second individual intermediate layer to concentrate the coolant or the flow of the coolant to the second area within the cold plate.

Figure 5B:
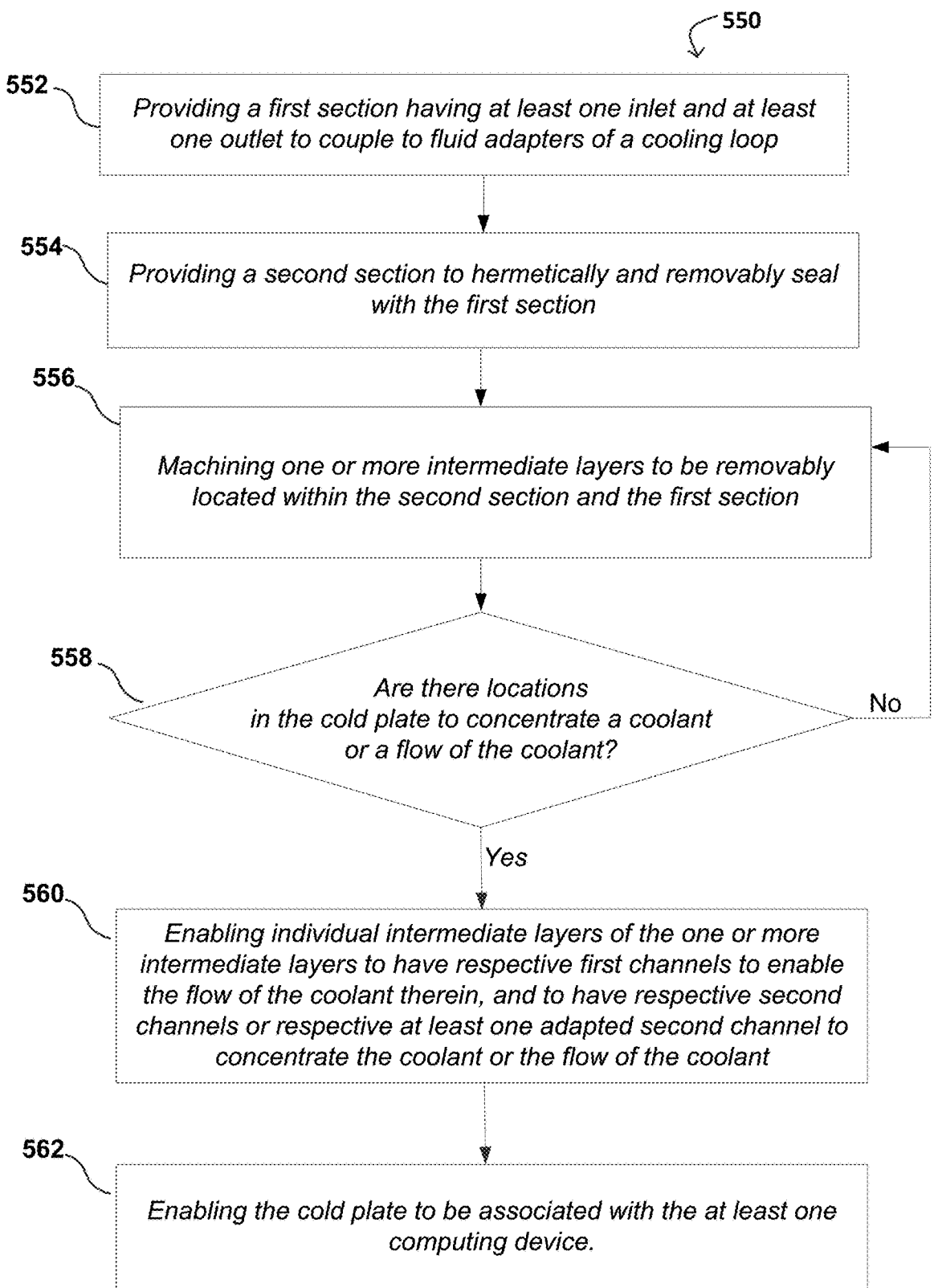
FIG. 5B is a process flow of steps available for a method of manufacturing the configurable cold plate of FIGS. 2A-4, according to at least one embodiment.

FIG. 5B is a process flow of steps available for a method 550 of manufacturing the configurable cold plate of FIGS. 2A-4, according to at least one embodiment. Step 552 provides a first section having at least one inlet and at least one outlet to couple to fluid adapters of a cooling loop. Step 554 provides a second section to hermetically and removably seal with the first section. In at least one embodiment, steps 552, 554 may be performed by a forming machine, by a forging machine, by a casting machine, by a 3-dimensional printer, or a computerized numerical control (CNC) machine.

Step 556 is a machining step for machining one or more intermediate layers, which are too be removably located within the second section and the first section. In at least one embodiment, steps 552, 554 may be performed beforehand, but step 556 may be performed on demand based in part on the computing device to be cooled by the cold plate. In at least one embodiment, step 558 is performed to determine if there are locations in the cold plate requiring concentration of a coolant or a flow of the coolant. This may be performed by inspecting the requirements of the computing device to be cooled.

When there are locations requiring the concentration of the coolant or its flow, step 560 is performed. In at least one embodiment, using step 560, the individual intermediate layers of the one or more intermediate layers are enabled (such as by machining) to have respective first channels to enable flow of a coolant therein, and to have respective second channels or respective at least one adapted second channel to concentrate the coolant or the flow of the coolant within the respective second channels or the respective at least one adapted second channel. As these benefits are tied to the requirements of the associated computing device, this step may be performed on-demand at the datacenter or in an infrastructure location of the datacenter capable of hosting a machining machines among the above referenced machines with respect to steps 552, 554. In at least one embodiment, the intermediate layer is partly machined to fit within the second section and be associated with the fluid adapters of the first section. However, the channels may be machined later, such as on-demand.

In at least one embodiment, a sub-step of steps 552, 554 may be to provide one or more gaskets to enable the hermetic and removable seal between the first section and the second section. In at least one embodiment, a further sub-step of steps 552, 554 provides one or more latch clips to enable the hermetic and removable seal between the first section and the second section. In at least one embodiment, with respect to step 560, when a sub-step determines a cooling requirement of at least one computing component, at least in part the heat generating feature of the at least one computing component, a further sub-step is performed for drilling first channels in the one or more intermediate layers to enable flow of the coolant therein; and for drilling second channels or machining at least one adapted second channel to concentrate the coolant or the flow of the coolant within the second channels or the at least one adapted second channel according to the location of the cooling requirement of the at least one computing component.

In at least one embodiment, with respect to step 560, when a sub-step determines a cooling requirement of at least one computing component, at least in part the heat generating feature of the at least one computing component, a further sub-step is performed for printing or growing the one or more intermediate layers to include first channels and to include second channels or at least one adapted second channel according to the location of the cooling requirement of the at least one computing component. Finally, the bottom section of the cold plate is cleaned and prepared for association with the at least one computing device in step 562.

Datacenter

Figure 6:
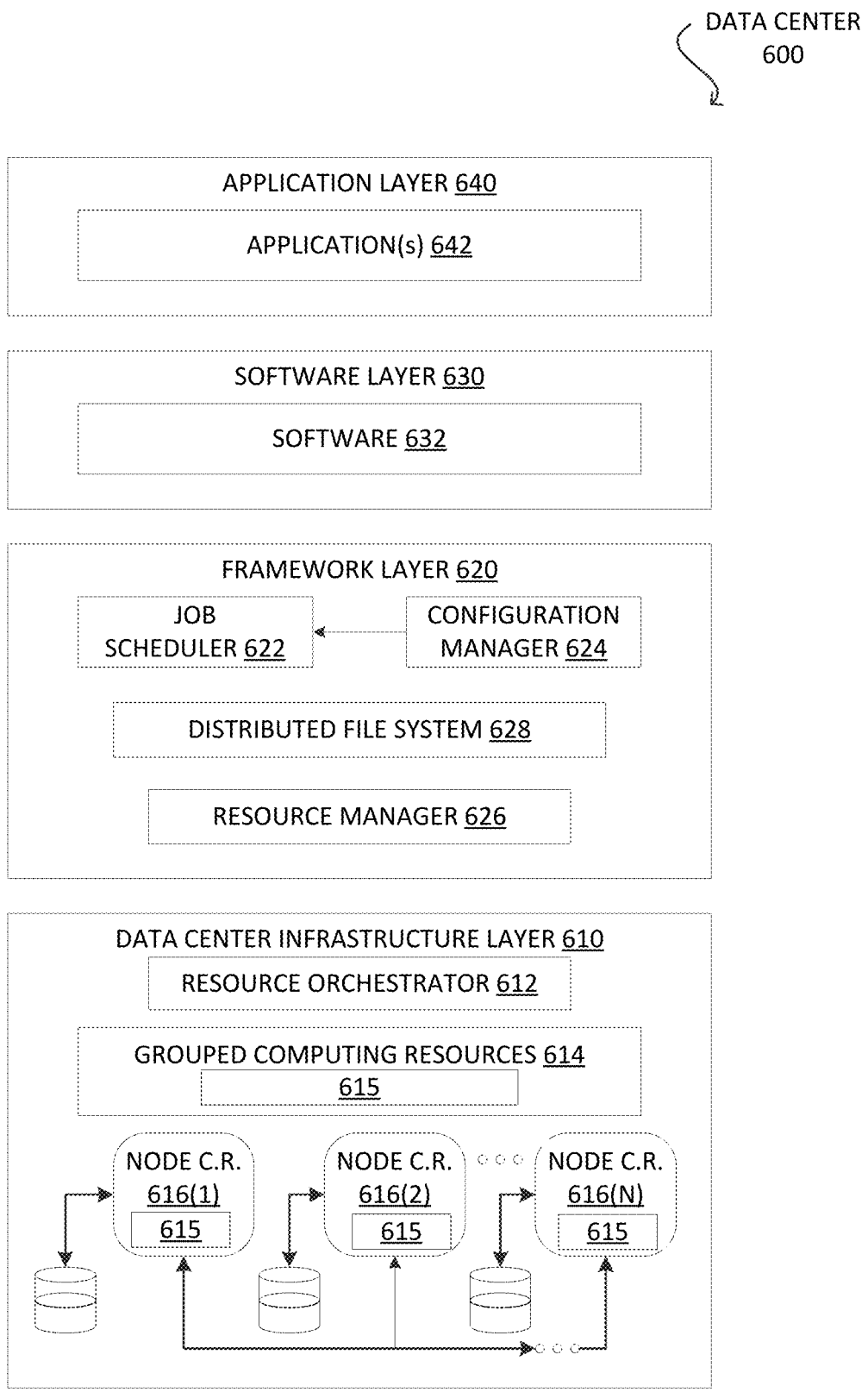
FIG. 6 illustrates an example datacenter, in which at least one embodiment from FIGS. 2A-5B may be used.

FIG. 6 illustrates an example datacenter 600, in which at least one embodiment from FIGS. 2A-5B may be used. In at least one embodiment, datacenter 600 includes a datacenter infrastructure layer 610, a framework layer 620, a software layer 630, and an application layer 640. In at least one embodiment, such as described in respect to FIGS. 2A-5B, features in the components associated with a configurable cold plate for a datacenter liquid cooling system may be performed inside or in collaboration with the example datacenter 600. In at least one embodiment, the infrastructure layer 610, the framework layer 620, the software layer 630, and the application layer 640 may be partly or fully provided via computing components on server trays located in racks 210 of the datacenter 200. This enables cooling systems of the present disclosure to direct cooling to certain ones of the computing components in an efficient and effective manner. Further, aspects of the datacenter, including the datacenter infrastructure layer 610, the framework layer 620, the software layer 630, and the application layer 640 may be used to support selection or design of the intermediate layers for a configurable cold plate as herein discussed with at least reference to FIGS. 2A-5B above. As such, the discussion in reference to FIG. 6 may be understood to apply to the hardware and software features required to enable or support a configurable cold plate for a datacenter liquid cooling system for the datacenter of FIGS. 2A-5B, for instance.

In at least one embodiment, as in FIG. 6, datacenter infrastructure layer 610 may include a resource orchestrator 612, grouped computing resources 614, and node computing resources ("node C.R.s") 616(1)-616(N), where "N" represents any whole, positive integer. In at least one embodiment, node C.R.s 616(1)-616(N) may include, but are not limited to, any number of central processing units ("CPUs") or other processors (including accelerators, field programmable gate arrays (FPGAs), graphics processors, etc.), memory devices (such as dynamic read-only memory), storage devices (such as solid state or disk drives), network input/output ("NW I/O") devices, network switches, virtual machines ("VMs"), power modules, and cooling modules, etc. In at least one embodiment, one or more node C.R.s from among node C.R.s 616(1)-616(N) may be a server having one or more of above-mentioned computing resources.

In at least one embodiment, grouped computing resources 614 may include separate groupings of node C.R.s housed within one or more racks (not shown), or many racks housed in datacenters at various geographical locations (also not shown). Separate groupings of node C.R.s within grouped computing resources 614 may include grouped compute, network, memory or storage resources that may be configured or allocated to support one or more workloads. In at least one embodiment, several node C.R.s including CPUs or processors may grouped within one or more racks to provide compute resources to support one or more workloads. In at least one embodiment, one or more racks may also include any number of power modules, cooling modules, and network switches, in any combination.

In at least one embodiment, resource orchestrator 612 may configure or otherwise control one or more node C.R.s 616(1)-616(N) and/or grouped computing resources 614. In at least one embodiment, resource orchestrator 612 may include a software design infrastructure ("SDI") management entity for datacenter 600. In at least one embodiment, resource orchestrator may include hardware, software or some combination thereof.

In at least one embodiment, as shown in FIG. 6, framework layer 620 includes a job scheduler 622, a configuration manager 624, a resource manager 626 and a distributed file system 628. In at least one embodiment, framework layer 620 may include a framework to support software 632 of software layer 630 and/or one or more application(s) 642 of application layer 640. In at least one embodiment, software 632 or application(s) 642 may respectively include web-based service software or applications, such as those provided by Amazon Web Services, Google Cloud and Microsoft Azure. In at least one embodiment, framework layer 620 may be, but is not limited to, a type of free and open-source software web application framework such as Apache Spark™ (hereinafter "Spark") that may utilize distributed file system 628 for large-scale data processing (such as "big data"). In at least one embodiment, job scheduler 622 may include a Spark driver to facilitate scheduling of workloads supported by various layers of datacenter 600. In at least one embodiment, configuration manager 624 may be capable of configuring different layers such as software layer 630 and framework layer 620 including Spark and distributed file system 628 for supporting large-scale data processing. In at least one embodiment, resource manager 626 may be capable of managing clustered or grouped computing resources mapped to or allocated for support of distributed file system 628 and job scheduler 622. In at least one embodiment, clustered or grouped computing resources may include grouped computing resource 614 at datacenter infrastructure layer 610. In at least one embodiment, resource manager 626 may coordinate with resource orchestrator 612 to manage these mapped or allocated computing resources.

In at least one embodiment, software 632 included in software layer 630 may include software used by at least portions of node C.R.s 616(1)-616(N), grouped computing resources 614, and/or distributed file system 628 of framework layer 620. One or more types of software may include, but are not limited to, Internet web page search software, e-mail virus scan software, database software, and streaming video content software.

In at least one embodiment, application(s) 642 included in application layer 640 may include one or more types of applications used by at least portions of node C.R.s 616(1)-616(N), grouped computing resources 614, and/or distributed file system 628 of framework layer 620. One or more types of applications may include, but are not limited to, any number of a genomics application, a cognitive compute, and a machine learning application, including training or inferencing software, machine learning framework software (such as PyTorch, TensorFlow, Caffe, etc.) or other machine learning applications used in conjunction with one or more embodiments.

In at least one embodiment, any of configuration manager 624, resource manager 626, and resource orchestrator 612 may implement any number and type of self-modifying actions based on any amount and type of data acquired in any technically feasible fashion. In at least one embodiment, self-modifying actions may relieve a datacenter operator of datacenter 600 from making possibly bad configuration decisions and possibly avoiding underutilized and/or poor performing portions of a datacenter.

In at least one embodiment, datacenter 600 may include tools, services, software or other resources to train one or more machine learning models or predict or infer information using one or more machine learning models according to one or more embodiments described herein. In at least one embodiment, in at least one embodiment, a machine learning model may be trained by calculating weight parameters according to a neural network architecture using software and computing resources described above with respect to datacenter 600. In at least one embodiment, trained machine learning models corresponding to one or more neural networks may be used to infer or predict information using resources described above with respect to datacenter 600 by using weight parameters calculated through one or more training techniques described herein. Deep learning may be advanced using any appropriate learning network and the computing capabilities of the datacenter 600. As such, a deep neural network (DNN), a recurrent neural network (RNN) or a convolutional neural network (CNN) may be supported either simultaneously or concurrently using the hardware in the datacenter. Once a network is trained and successfully evaluated to recognize data within a subset or a slice, for instance, the trained network can provide similar representative data for using with the collected data.

In at least one embodiment, datacenter 600 may use CPUs, application-specific integrated circuits (ASICs), GPUs, FPGAs, or other hardware to perform training and/or inferencing using above-described resources. Moreover, one or more software and/or hardware resources described above may be configured as a service to allow users to train or performing inferencing of information, such as pressure, flow rates, temperature, and location information, or other artificial intelligence services.

Inference and Training Logic

Inference and/or training logic 615 may be used to perform inferencing and/or training operations associated with one or more embodiments. In at least one embodiment, inference and/or training logic 615 may be used in system FIG. 6 for inferencing or predicting operations based, at least in part, on weight parameters calculated using neural network training operations, neural network functions and/or architectures, or neural network use cases described herein. In at least one embodiment, inference and/or training logic 615 may include, without limitation, hardware logic in which computational resources are dedicated or otherwise exclusively used in conjunction with weight values or other information corresponding to one or more layers of neurons within a neural network. In at least one embodiment, inference and/or training logic 615 may be used in conjunction with an application-specific integrated circuit (ASIC), such as Tensorflow® Processing Unit from Google, an inference processing unit (IPU) from Graphcore™, or a Nervana® (such as "Lake Crest") processor from Intel Corp.

In at least one embodiment, inference and/or training logic 615 may be used in conjunction with central processing unit (CPU) hardware, graphics processing unit (GPU) hardware or other hardware, such as field programmable gate arrays (FPGAs). In at least one embodiment, inference and/or training logic 615 includes, without limitation, code and/or data storage modules which may be used to store code (such as graph code), weight values and/or other information, including bias values, gradient information, momentum values, and/or other parameter or hyperparameter information. In at least one embodiment, each of the code and/or data storage modules is associated with a dedicated computational resource. In at least one embodiment, the dedicated computational resource includes computational hardware that further include one or more ALUs that perform mathematical functions, such as linear algebraic functions, only on information stored in code and/or data storage modules, and results from which are stored in an activation storage module of the inference and/or training logic 615.

Other variations are within spirit of present disclosure. Thus, while disclosed techniques are susceptible to various modifications and alternative constructions, certain illustrated embodiments thereof are shown in drawings and have been described above in detail. It should be understood, however, that there is no intention to limit disclosure to specific form or forms disclosed, but on contrary, intention is to cover all modifications, alternative constructions, and equivalents falling within spirit and scope of disclosure, as defined in appended claims.

Use of terms "a" and "an" and "the" and similar referents in context of describing disclosed embodiments (especially in context of following claims) are to be construed to cover both singular and plural, unless otherwise indicated herein or clearly contradicted by context, and not as a definition of a term. Terms "including," "having," "including," and "containing" are to be construed as open-ended terms (meaning "including, but not limited to,") unless otherwise noted. Term "connected," when unmodified and referring to physical connections, is to be construed as partly or wholly contained within, attached to, or joined together, even if there is something intervening. Recitation of ranges of values herein are merely intended to serve as a shorthand method of referring individually to each separate value falling within range, unless otherwise indicated herein and each separate value is incorporated into specification as if it were individually recited herein. Use of a set (such as a set of items) or subset, unless otherwise noted or contradicted by context, is to be construed as a nonempty collection including one or more members. Further, unless otherwise noted or contradicted by context, a subset of a corresponding set does not necessarily denote a proper subset of corresponding set, but subset and corresponding set may be equal.

Conjunctive language, such as phrases of form "at least one of A, B, and C," or "at least one of A, B and C," unless specifically stated otherwise or otherwise clearly contradicted by context, is otherwise understood with context as used in general to present that an item, term, etc., may be either A or B or C, or any nonempty subset of set of A and B and C. For instance, in illustrative example of a set having three members, conjunctive phrases "at least one of A, B, and C" and "at least one of A, B and C" refer to any of following sets: {A}, {B}, {C}, {A, B}, {A, C}, {B, C}, {A, B, C}. Thus, such conjunctive language may not be intended to imply that certain embodiments require at least one of A, at least one of B, and at least one of C each to be present. In addition, unless otherwise noted or contradicted by context, a plurality indicates a state of being plural (such as a plurality of items indicates multiple items). A plurality is at least two items, but can be more when so indicated either explicitly or by context. Further, unless stated otherwise or otherwise clear from context, based on means based at least in part on and not based solely on.

Operations of processes described herein can be performed in any suitable order unless otherwise indicated herein or otherwise clearly contradicted by context. In at least one embodiment, a process such as those processes described herein (or variations and/or combinations thereof) is performed under control of one or more computer systems configured with executable instructions and is implemented as code (such as executable instructions, one or more computer programs or one or more applications) executing collectively on one or more processors, by hardware or combinations thereof. In at least one embodiment, code is stored on a computer-readable storage medium, for example, in form of a computer program including a plurality of instructions executable by one or more processors. In at least one embodiment, a computer-readable storage medium is a non-transitory computer-readable storage medium that excludes transitory signals (such as a propagating transient electric or electromagnetic transmission) but includes non-transitory data storage circuitry (such as buffers, cache, and queues) within transceivers of transitory signals. In at least one embodiment, code (such as executable code or source code) is stored on a set of one or more non-transitory computer-readable storage media having stored thereon executable instructions (or other memory to store executable instructions) that, when executed (in at least one embodiment, as a result of being executed) by one or more processors of a computer system, cause computer system to perform operations described herein. A set of non-transitory computer-readable storage media, in at least one embodiment, includes multiple non-transitory computer-readable storage media and one or more of individual non-transitory storage media of multiple non-transitory computer-readable storage media lack all of code while multiple non-transitory computer-readable storage media collectively store all of code. In at least one embodiment, executable instructions are executed such that different instructions are executed by different processors—for example, a non-transitory computer-readable storage medium store instructions and a main central processing unit ("CPU") executes some of instructions while a graphics processing unit ("GPU") executes other instructions. In at least one embodiment, different components of a computer system have separate processors and different processors execute different subsets of instructions.

Accordingly, in at least one embodiment, computer systems are configured to implement one or more services that singly or collectively perform operations of processes described herein and such computer systems are configured with applicable hardware and/or software that enable performance of operations. Further, a computer system that implements at least one embodiment of present disclosure is a single device and, in another embodiment, is a distributed computer system including multiple devices that operate differently such that distributed computer system performs operations described herein and such that a single device does not perform all operations.

Use of any and all examples, or exemplary language (such as "such as") provided herein, is intended merely to better illuminate embodiments of disclosure and does not pose a limitation on scope of disclosure unless otherwise claimed. No language in specification should be construed as indicating any non-claimed element as essential to practice of disclosure.

All references, including publications, patent applications, and patents, cited herein are hereby incorporated by reference to same extent as if each reference were individually and specifically indicated to be incorporated by reference and were set forth in its entirety herein.

In description and claims, terms "coupled" and "connected," along with their derivatives, may be used. It should be understood that these terms may be not intended as synonyms for each other. Rather, in particular examples, "connected" or "coupled" may be used to indicate that two or more elements are in direct or indirect physical or electrical contact with each other. "Coupled" may also mean that two or more elements are not in direct contact with each other, but yet still co-operate or interact with each other.

Unless specifically stated otherwise, it may be appreciated that throughout specification, references to processing, computing, calculating, determining, or the like, refer to action and/or processes of a computer or computing system, or similar electronic computing device, that manipulate and/or transform data represented as physical, such as electronic, quantities within computing system's registers and/or memories into other data similarly represented as physical quantities within computing system's memories, registers or other such information storage, transmission or display devices.

In a similar manner, a processor may refer to any device or portion of a device that processes electronic data from registers and/or memory and transform that electronic data into other electronic data that may be stored in registers and/or memory. As non-limiting examples, "processor" may be a CPU or a GPU. A "computing platform" may include one or more processors. As used herein, "software" processes may include, for example, software and/or hardware entities that perform work over time, such as tasks, threads, and intelligent agents. Also, each process may refer to multiple processes, for carrying out instructions in sequence or in parallel, continuously or intermittently. Terms "system" and "method" are used herein interchangeably insofar as system may embody one or more methods and methods may be considered a system.

In present document, references may be made to obtaining, acquiring, receiving, or inputting analog or digital data into a subsystem, computer system, or computer-implemented machine. Obtaining, acquiring, receiving, or inputting analog and digital data can be accomplished in a variety of ways such as by receiving data as a parameter of a function call or a call to an application programming interface. In some implementations, process of obtaining, acquiring, receiving, or inputting analog or digital data can be accomplished by transferring data via a serial or parallel interface. In another implementation, process of obtaining, acquiring, receiving, or inputting analog or digital data can be accomplished by transferring data via a computer network from providing entity to acquiring entity. References may also be made to providing, outputting, transmitting, sending, or presenting analog or digital data. In various examples, process of providing, outputting, transmitting, sending, or presenting analog or digital data can be accomplished by transferring data as an input or output parameter of a function call, a parameter of an application programming interface or interprocess communication mechanism.

Although discussion above sets forth example implementations of described techniques, other architectures may be used to implement described functionality, and are intended to be within scope of this disclosure. Furthermore, although specific distributions of responsibilities are defined above for purposes of discussion, various functions and responsibilities might be distributed and divided in different ways, depending on circumstances.

Furthermore, although subject matter has been described in language specific to structural features and/or methodological acts, it is to be understood that subject matter claimed in appended claims is not necessarily limited to specific features or acts described. Rather, specific features and acts are disclosed as exemplary forms of implementing the claims.

What is claimed is:

1. A cold plate for a datacenter liquid cooling system, comprising:
    a first section, a second section, and an intermediate layer, the intermediate layer to be changeable and to comprise first channels to enable flow of a coolant through the intermediate layer and second channels or at least one adapted second channel to concentrate the coolant or the flow of the coolant to at least one area within the cold plate, the second channels or the at least one adapted second channel located in the intermediate layer to correspond to at least a heat generating feature of an associated computing device.

2. The cold plate of claim 1, further comprising:
    one or more gaskets associated with at least the first section or the second section to enable a hermetic seal once the first section and the second section is closed together.

3. The cold plate of claim 1, further comprising:
    fluid adapters to extend from the cold plate to enable receipt and egress of the coolant between the cold plate and at least a cooling manifold.

4. The cold plate of claim 1, further comprising:
    a second intermediate layer comprising at least a third channel and a fourth channel, the second intermediate layer to be used with the first section and the second section to address second heat generated by a second component of a second associated computing device.

5. The cold plate of claim 1, further comprising:
    one or more first inlets in the intermediate layer to correspond with one or more second inlets of the first section; and
    one or more first outlets in the intermediate layer to correspond with one or more second inlets of the first section.

6. The cold plate of claim 1, further comprising:
    slots to traverse a length of the second channels or of the at least one adapted second channel, the slots to have surface areas to concentrate the coolant or the flow of the coolant to the at least one area.

7. The cold plate of claim 1, further comprising:
slots in the intermediate layer of the cold plate, an individual slot of the slots having at least one first dimension that is different relative to an individual first channel in the first channels and across their respective cross-sections; and
a second intermediate layer that is to be used in the alternative of the intermediate layer, individual second slots of the second intermediate layer having at least one second dimension that is different relative to the at least one first dimension and to concentrate more or less the coolant or the flow of the coolant to the at least one area or to a different area within the cold plate.

8. The cold plate of claim 7, further comprising:
the individual slot of the slots having one of a diameter, an angle, or a width as the at least one dimension.

9. A datacenter liquid cooling system, comprising: a cold plate having a first section, a second section, and an intermediate layer, the intermediate layer to be changeable and to comprise first channels to enable flow of a coolant through the intermediate layer and second channels or at least one adapted second channel to concentrate the coolant or the flow of the coolant to at least one area within the cold plate, the second channels or the at least one adapted second channel located in the intermediate layer to correspond to at least a heat generating component of an associated computing device.

10. The datacenter liquid cooling system of claim 9, further comprising:
surface adaptations or material adaptations of the at least one adapted second channel to enable a first heat transfer to the coolant in the at least one area within the cold plate that is more than a second heat transfer to the coolant in the first channel.

11. The datacenter liquid cooling system of claim 9, further comprising:
fluid adapters to extend from the cold plate, the fluid adapters to enable receipt and egress of the coolant between the cold plate and at least a cooling manifold of the datacenter liquid cooling system.

12. The datacenter liquid cooling system of claim 9, further comprising:
one or more first inlets in the intermediate layer to correspond with one or more second inlets of the first section; and
one or more first outlets in the intermediate layer to correspond with one or more second inlets of the first section.

13. The datacenter liquid cooling system of claim 9, further comprising:
slots in the intermediate layer of the cold plate, the slots traversing a length of the second channels or of the at least one adapted second channel to provide surface areas to concentrate the coolant or the flow of the coolant to the at least one area.

14. The datacenter liquid cooling system of claim 9, further comprising:
slots in the intermediate layer of the cold plate, an individual slot of the slots having at least one first dimension that is different relative to an individual first channel in the first channels and across their respective cross-sections; and
a second intermediate layer that is to be used in the alternative of the intermediate layer, individual second slots of the second intermediate layer having at least one second dimension that is different relative to the at least one first dimension and to concentrate more or less the coolant or the flow of the coolant to the at least one area or to a different area within the cold plate.

15. The datacenter liquid cooling system of claim 14, further comprising:
the individual slot of the slots having one of a diameter, an angle, or a width as the at least one first dimension.

* * * * *